United States Patent
Jeong et al.

(10) Patent No.: US 8,941,411 B2
(45) Date of Patent: Jan. 27, 2015

(54) SIGNAL TRANSMISSION CIRCUIT

(71) Applicants: SK Hynix Inc., Gyeonggi-do (KR); Industry-University Cooperation Foundation Hanyang University, Seoul (KR)

(72) Inventors: Chun-Seok Jeong, Gyeonggi-do (KR); Young-Hoon Kim, Seoul (KR); Chang-Sik Yoo, Seoul (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 53 days.

(21) Appl. No.: 13/843,994

(22) Filed: Mar. 15, 2013

(65) Prior Publication Data

US 2014/0176260 A1 Jun. 26, 2014

(30) Foreign Application Priority Data

Dec. 20, 2012 (KR) ........................ 10-2012-0149955

(51) Int. Cl.
*H03K 17/16* (2006.01)
*H03H 7/06* (2006.01)

(52) U.S. Cl.
CPC ..................... *H03H 7/06* (2013.01)
USPC .................................. 326/82; 326/21; 326/26

(58) Field of Classification Search
CPC ....... H03K 17/16; H04L 25/08; H05K 1/0216
USPC ............................. 326/21, 26, 27, 82, 83, 87
See application file for complete search history.

(56) References Cited

U.S. PATENT DOCUMENTS

| 7,864,605 | B2 | 1/2011 | Lee et al. |
| 8,036,051 | B2 * | 10/2011 | Park et al. ...................... 365/198 |
| 8,760,188 | B2 * | 6/2014 | Gondi et al. .................... 326/30 |
| 2006/0244108 | A1 * | 11/2006 | Forbes .......................... 257/664 |
| 2007/0268047 | A1 * | 11/2007 | Hopkins et al. ............... 327/111 |
| 2013/0147547 | A1 * | 6/2013 | Nalawade et al. ............ 327/551 |

FOREIGN PATENT DOCUMENTS

KR 1020110046775 5/2011

* cited by examiner

*Primary Examiner* — Don Le
(74) *Attorney, Agent, or Firm* — IP & T Group LLP

(57) ABSTRACT

A signal transmission circ it includes a main driving unit configured to drive a first signal transmission One in response to an input signal and output a first driven signal, an emphasis driving unit configured to perform an emphasis operation on the first driven signal and output an emphasized signal, and a crosstalk control unit configured to perform an equalizing operation on the emphasized signal.

17 Claims, 3 Drawing Sheets

SIGNAL TRANSMISSION CIRCUIT

CROSS-REFERENCE TO RELATED APPLICATIONS

The present application claims priority of Korean Patent Application No. 10-2012-0149955, filed on Dec. 20, 2012, which is incorporated herein by reference in its entirety.

BACKGROUND

1. Field

Exemplary embodiments of the present invention relate to a semiconductor design technology, and more particularly, to a signal transmission circuit that transfers various signals through a plurality of signal transmission lines.

2. Description of the Related Art

In general, a semiconductor device, e.g., Double Data Rate Synchronous DRAM (DDR SDRAM), receives various signals from an external controller, performs a desired circuit operation, and outputs a result achieved through the circuit operation to an exterior. In this regard, the semiconductor device may have a signal transmission circuit for transferring such signals inside as well as the external controller. The object of the signal transmission circuit is to transfer a predetermined signal from a desired start point to a desired target point through a signal transmission line.

Meanwhile, with the development of a process technology, a line width of a signal transmission line is gradually reduced, and an interval between signal transmission lines is also gradually reduced. The development of the process technology may considerably reduce an area where the signal transmission lines are arranged, but may cause new concerns that may not be important factors in an operation of the conventional art.

Recently, one of the biggest concerns caused by the reduction of an interval between the signal transmission lines is a signal distortion due to crosstalk.

FIG. 1 is a circuit diagram illustrating a conventional signal transmission circuit.

Referring to FIG. 1, the signal transmission circuit includes a main driving unit 110 and a crosstalk equalizing driving unit 120.

The main driving unit 110 drives a first signal transmission line DQ1_OUT to a predetermined voltage level in response to a first input signal DQ1. The crosstalk equalizing driving unit 120 compensates for the first signal transmission line DQ1_OUT in response to second to fourth input signals DQ2, DQ3, and DQ4 that are transferred through second to fourth signal transmission lines adjacently arranged to the first signal transmission line DQ1_OUT.

As illustrated in FIG. 1, in the conventional art, the second to fourth input signals DQ2, DQ3, and DQ4 and second to fourth inverted and delayed input signals DQ2B, DQ3B, and DQ4B, which are achieved by inverting and delaying the second to fourth input signals DQ2, DQ3, and DQ4 respectively, are used in order to compensate for signal distortion of the first signal transmission line DQ1_OUT. That is, the crosstalk equalizing driving unit 120 reflects compensation values, which correspond to the second to fourth input signals DQ2, DQ3, and DQ4 and the second to fourth inverted and delayed input signals DQ2B, DQ3B, and DQ4B, in the first signal transmission line DQ1_OUT.

Hereinafter, signal distortion of an input signal will be described by employing the first and second input signals DQ1 and DQ2 as an example.

In the state in which the first input signal DQ1 and the second input signal DQ2 are transferred through signal transmission lines adjacent to each other, when the second input signal DQ2 is changed from logic 'low' level to logic 'high' level, signal distortion to logic 'low' level from logic 'high' level may occur in a first input signal DQ1 of a receiving circuit that receives the first and second input signals DQ1 and DQ2. Meanwhile, when the second input signal DQ2 is changed from logic 'high' level to logic 'low' level, signal distortion to logic 'high' level from logic 'low' level may occur in the first input signal DQ1 of the receiving circuit.

In this regard, a transmission circuit may have a circuit for compensating for the signal distortion, and the crosstalk equalizing driving unit 120 corresponds to the circuit for compensating for the signal distortion. That is, the crosstalk equalizing driving unit 120 adds the compensation values, which correspond to the second to fourth input signals DQ2, DQ3, and DQ4 and the second to fourth inverted and delayed input signals DQ2B, DQ3B, and DQ4B, to the first input signal DQ1 to generate a compensated first input signal, and transfers the compensated first input signal through the first signal transmission line DQ1_OUT. In other words, in order for the receiving circuit to receive a signal substantially equal to the first input signal DQ1, the signal transmission circuit should transfer a signal, which is achieved by adding the compensation value to the first input signal DQ1, through the first signal transmission line DQ1_OUT.

In the case of the structure as illustrated in FIG. 1, it may be desirable to increase the driving force of the crosstalk equalizing driving unit 120 in order to compensate for large signal distortion. However, the driving force is adjusted, resulting in a change in the impedance of the signal transmission circuit. That is, since the driving force of the crosstalk equalizing driving unit 120 and the impedance of the transmission circuit may be controlled in combination with each other, it may be difficult to adjust one of the driving force of the crosstalk equalizing driving unit 120 and the impedance of the transmission circuit. This represents that the driving force of the crosstalk equalizing driving unit 120 and the impedance of the transmission circuit are adjusted in a certain limited manner.

In more detail, for example, in the state in which the main driving unit 110 has a predetermined driving force, the driving force of the crosstalk equalizing driving unit 120 is set as a larger value in order to increase a compensation value, resulting in a change in the impedance of the signal transmission circuit. Therefore, for impedance matching, the driving force of the main driving unit 110 is set to be small. However, in this case, since the amplitude of an input signal transferred from the main driving unit 110 is reduced, it may be difficult for the receiving circuit to determine the input signal.

Recently, various technologies have been developed in order to transfer signals more apparently and quickly. Among them, there exist a pre-emphasis technology and a de-emphasis technology, which emphasize a specific part of a signal to be transferred. However, in the state in which the driving force and the impedance are adjusted in a given limited manner, it may be difficult to newly add a circuit for performing a de-emphasis operation.

SUMMARY

Exemplary embodiments of the present invention are directed to a signal transmission circuit capable of performing both an emphasis operation and an equalizing operation.

In accordance with an embodiment of the present invention, a signal transmission circuit includes a main driving unit configured to drive a first signal transmission line in response to an input signal and output a first driven signal, an emphasis driving unit configured to perform an emphasis operation on the first driven signal and output an emphasized signal, and a crosstalk control unit configured to perform an equalizing operation on the emphasized signal.

In accordance with another embodiment of the present invention, a signal transmission circuit includes a main driving unit configured to drive a first input signal and output a first driven signal to a first signal transmission line, an emphasis driving unit configured to perform an emphasis operation on the first driven signal; a sub-driving section configured to receive a second input signal transferred through a second signal transmission line, and a capacitor configured to reflect a predetermined capacitance in an output signal of the sub-driving section, and to add a resultant signal to the first signal transmission line.

In accordance with another embodiment of the present invention, a signal transmission circuit includes a main driving unit configured to drive a first input signal and output a first driven signal to a first signal transmission line, an emphasis driving unit configured to perform an emphasis operation on the first driven signal, and a crosstalk control unit configured to reflect partial information of a second input signal transferred through a second signal transmission line in the first signal transmission line at given unit time, preferably at every given unit time.

In accordance with still another embodiment of the present invention, a signal transmission circuit includes a main driving unit configured to drive a first signal transmission line in response to a first input signal and output a first driven signal, an emphasis driving unit configured to perform an emphasis operation on the first driven signal and output an emphasized signal, and a crosstalk control unit configured to perform an equalizing operation on the emphasized signal based on a second input signal transferred through a second transmission line adjacent to a first transmission line configured to transfer the first input signal.

The signal transmission circuit according to the embodiment of the present invention performs both an emphasis operation and an equalizing operation, thereby improving signal transfer characteristics thereof.

The signal transfer characteristics are improved through the emphasis operation and the equalizing operation, so that it is possible to transfer high quality signals more quickly.

DETAILED DESCRIPTION

Figure 1:
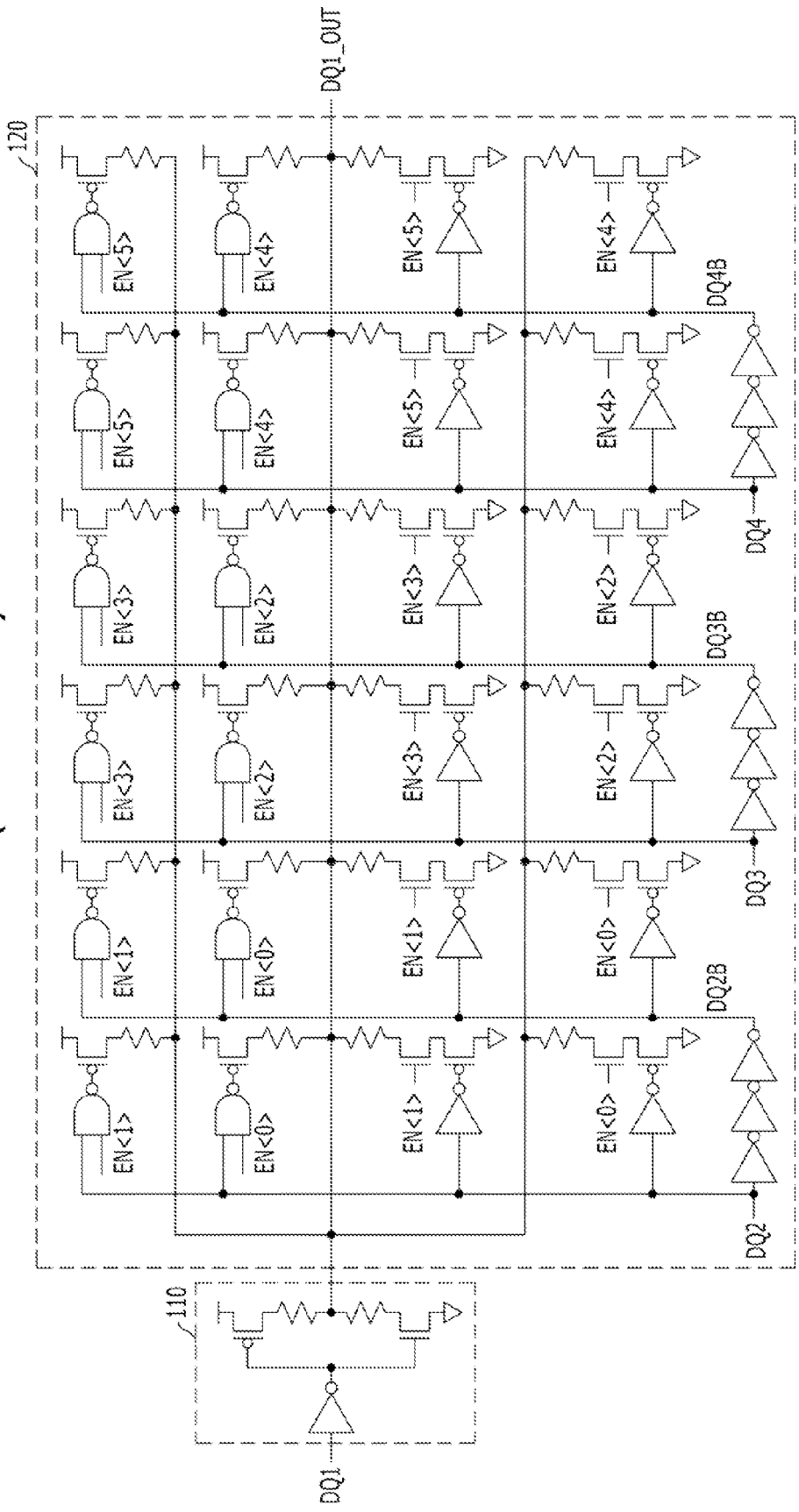
FIG. 1 is a circuit diagram illustrating a conventional signal transmission circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
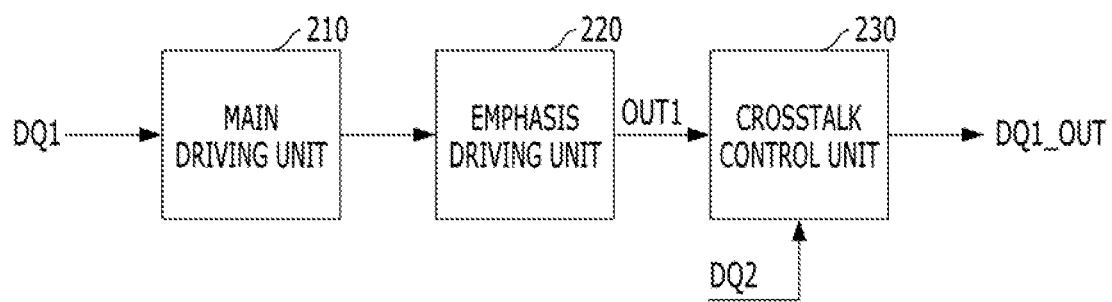
FIG. 2 is a block diagram illustrating a signal transmission circuit in accordance with an embodiment of the present invention.

FIG. 2 is a block diagram illustrating a signal transmission circuit in accordance with an embodiment of the present invention.

Referring to FIG. 2, the signal transmission circuit includes a main driving unit 210, an emphasis driving unit 220, and a crosstalk control unit 230.

The main driving unit 210 is configured to drive and output an input signal DQ1, and the emphasis driving unit 220 is configured to perform an emphasis operation, such as a pre-emphasis operation and a de-emphasis operation, on an output signal of the main driving unit 210, and to output an emphasized signal. The crosstalk control unit 230 is configured to perform an equalizing operation on the emphasized signal from the emphasis driving unit 220, and to output an equalized signal. In the embodiment of the present invention, since the crosstalk control unit 230 is able to compensate for a signal using capacitance, it is possible to add the emphasis driving unit 220, which will be described later.

In the signal transmission circuit in accordance with the embodiment of the present invention, the emphasis driving unit 220 is arranged next to the main driving unit 210, and the crosstalk control unit 230 is arranged next to the emphasis driving unit 220. That is, the input signal DQ1 is input to and driven by the main driving unit 210, is subject to the emphasis operation of the emphasis driving unit 220, is subject to the equalizing operation of the crosstalk control unit 230, and then is transmitted to a receiving terminal.

Figure 3:
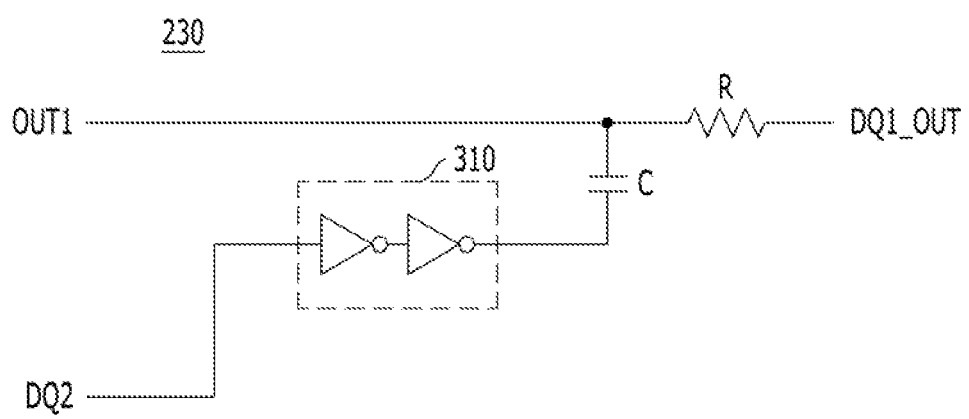
FIG. 3 is a diagram illustrating a crosstalk control unit shown in FIG. 2.

FIG. 3 is a diagram illustrating the crosstalk control unit 230 shown in FIG. 2.

Referring to FIG. 3, the crosstalk control unit 230 is configured to differentiate a second input signal DQ2 and reflect a differentiated signal in a first signal transmission line DQ1_, OUT, and includes a sub-driving section 310, a capacitor C, and a resistor R. The second input signal DQ2 is transferred through a second signal transmission line (not illustrated) adjacently arranged to the first signal transmission line DQ1_OUT.

The sub-driving section 310 is configured to receive and output the second input signal DQ2, and the capacitor C is configured to reflect predetermined capacitance in an output signal of the sub-driving section 310, and to add a resultant signal to the first signal transmission line DQ1_OUT. The resistor R is inserted on the first signal transmission line DQ1_OUT.

The signal transmission circuit in accordance with the embodiment of the present invention includes the crosstalk control unit 230 in order to compensate for signal distortion occurring in the first signal transmission line DQ1_OUT. The crosstalk control unit 230 differentiates the second input signal DQ2 and reflects a differentiated signal in the first signal transmission line DQ1_OUT. For example, the crosstalk control unit 230 has a high pass filter. The capacitor C has a predetermined capacitance, the capacitance may be adjustable through a data training operation. The capacitance set by this manner is reflected in a compensation operation for crosstalk.

Meanwhile, the aforementioned differentiation represents that partial information of the second input signal DQ2 is reflected in the first signal transmission line DQ1_OUT at a given unit time, preferably at every given unit time, wherein the given unit time is also changeable by changing the driving force of the sub-driving section 310.

The signal transmission circuit in accordance with the embodiment of the present invention may adjust the capacitance when performing the equalizing operation. Accordingly, even when an additional circuit is arranged to the first signal transmission line DQ1_OUT, since influence of the additional circuit to impedance is small, the additional circuit may be arranged.

Figure 4:
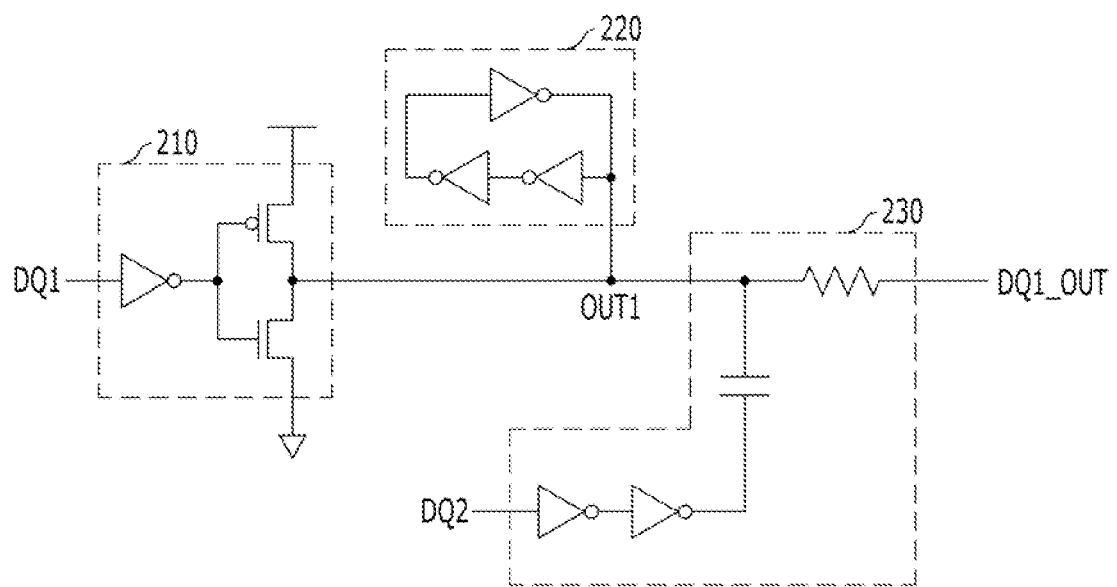
FIG. 4 is a circuit diagram illustrating a signal transmission circuit shown in FIG. 2 in more detail.

FIG. 4 is a circuit diagram for explaining each element of the signal transmission circuit illustrated in FIG. 2 in more detail. For the purpose of convenience, the same reference numerals are used to designate the same configurations as those shown in FIG. 2.

Referring to FIG. 4, the signal transmission circuit includes the main driving unit 210, the emphasis driving unit 220, and the crosstalk control unit 230. The embodiment employs a configuration, in which the emphasis driving unit 220 performs a de-emphasis operation, as an example.

The main driving unit 210 drives and outputs the input signal DQ1, and the emphasis driving unit 220 performs the de-emphasis operation on the output signal of the main driving unit 210, and outputs a resultant signal. The crosstalk control unit 230 performs the equalizing operation on the output signal of the emphasis driving unit 220, and outputs a resultant signal.

In the signal transmission circuit in accordance with the embodiment of the present invention, the crosstalk control unit 230 may adjust capacitance to perform the equalizing operation. Consequently, it is possible to add the emphasis driving unit 220 that performs the de-emphasis operation, as illustrated in FIG. 3.

As described above, the signal transmission circuit in accordance with the embodiment of the present invention is able to perform the emphasis operation as well as the equalizing operation. This represents that it is possible to substantially prevent a signal distortion phenomenon on adjacent signal transmission lines through the equalizing operation, and it is possible to substantially prevent loss in transfer of a high frequency signal through the emphasis operation.

While the present invention has been described with respect to the specific embodiments, it will be apparent to those skilled in the art that various changes and modifications may be made without departing from the spirit and scope of the invention as defined in the following claims.

Moreover, the positions and types of the logic gates and transistors in the aforementioned embodiment may be changed according to the polarity of an input signal.

What is claimed is:

1. A signal transmission circuit comprising:
   a main driving unit configured to drive a first signal transmission line in response to an input signal and output a first driven signal;
   an emphasis driving unit configured to perform an emphasis operation on the first driven signal and output an emphasized signal;
   a first crosstalk control unit configured to perform an equalizing operation on the emphasized signal and differentiate a second input signal transferred through a second signal transmission line, and to reflect a differentiated signal in the first signal transmission line; and
   a second crosstalk control unit configured to perform an equalizing operation on a signal from the first crosstalk control unit and differentiate a third input signal transferred through a third signal transmission line, and to reflect a differentiated signal in the first signal transmission line.

2. The signal transmission circuit of claim 1, wherein the emphasis operation includes a de-emphasis operation.

3. The signal transmission circuit of claim 1, wherein the first signal transmission line and the second signal transmission line are arranged adjacent to each other.

4. The signal transmission circuit of claim 1, wherein the crosstalk control unit has a filter.

5. The signal transmission circuit of claim 1, wherein the crosstalk control unit has a high pass filter.

6. A signal transmission circuit comprising:
   a main driving unit configured to drive a first input signal and output a first driven signal to a first signal transmission line;
   an emphasis driving unit configured to perform an emphasis operation on the first driven signal;
   a sub-driving section configured to receive a second input signal transferred through a second signal transmission line;
   a capacitor configured to reflect a predetermined capacitance in an output signal of the sub-driving section, and to add a resultant signal to the first signal transmission line; and
   a resistor disposed on the first signal transmission line.

7. The signal transmission circuit of claim 6, wherein the capacitor is configured to adjust the predetermined capacitance in response to a control signal.

8. The signal transmission circuit of claim 7, wherein the control signal is defined through a data training operation.

9. The signal transmission circuit of claim 6, wherein the first signal transmission line and the second signal transmission line are arranged adjacent to each other.

10. The signal transmission circuit of claim 6, wherein the emphasis operation includes a de-emphasis operation.

11. A signal transmission circuit comprising:
    a main driving unit configured to drive a first input signal and output a first driven signal to a first signal transmission line;
    an emphasis driving unit configured to perform an emphasis operation on the first driven signal;
    a crosstalk control unit configured to reflect partial information of a second input signal transferred through a second signal transmission line in the first signal transmission line at every given unit time; and
    a resistor disposed on the first signal transmission line,
    wherein the crosstalk control unit comprises:
       a sub-driving section configured to drive the second input signal by a predetermined driving force: and
       a capacitor configured to reflect a predetermined capacitance in an output signal of the sub-driving section, and to add a resultant signal to the first signal transmission line.

12. The signal transmission circuit of claim 11, wherein the capacitor is configured to adjust the predetermined capacitance in response to a control signal.

13. The signal transmission circuit of claim 12, wherein the control signal is defined through a data training operation.

14. The signal transmission circuit of claim 11, wherein the every given unit time is changed according to the driving force of the sub-driving section.

15. The signal transmission circuit of claim 11, wherein the first signal transmission line and the second signal transmission line are arranged adjacent to each other.

16. The signal transmission circuit of claim 11, wherein the emphasis operation includes a de-emphasis operation.

17. A signal transmission circuit comprising:
    a main driving unit configured to drive a first signal transmission line in response to a first input signal and output a first driven signal;

an emphasis driving unit configured to perform an emphasis operation on the first driven signal and output an emphasized signal;
a first crosstalk control unit configured to perform an equalizing operation on the emphasized signal based on a second input signal transferred through a second transmission line adjacent to a first transmission line configured to transfer the first input signal and
a second crosstalk control unit configured to perform an equalizing operation on a signal from the first crosstalk control unit based on a third input signal transferred through a third transmission line adjacent to a first transmission line configured to transfer the first input signal.

* * * * *